United States Patent
Naruta et al.

(10) Patent No.: US 6,931,609 B2
(45) Date of Patent: Aug. 16, 2005

(54) CAPACITANCE PARAMETERS CALCULATION METHOD FOR MOSFET AND PROGRAM THEREFOR

(75) Inventors: Yasuhisa Naruta, Kawasaki (JP); Shigetaka Kumashiro, Kawasaki (JP)

(73) Assignee: NEC Electronics Corporation (JP)

( * ) Notice: Subject to any disclaimer, the term of this patent is extended or adjusted under 35 U.S.C. 154(b) by 39 days.

(21) Appl. No.: 10/739,464

(22) Filed: Dec. 18, 2003

(65) Prior Publication Data

US 2004/0133862 A1 Jul. 8, 2004

(30) Foreign Application Priority Data

Dec. 20, 2002 (JP) ........................................ 2002-370137

(51) Int. Cl.[7] .............................................. G06F 17/50
(52) U.S. Cl. .................... 716/4; 716/5; 716/6
(58) Field of Search ......................... 716/4–6; 703/2–4, 703/14–16, 19

(56) References Cited

U.S. PATENT DOCUMENTS

| | | | | | |
|---|---|---|---|---|---|
| 5,467,291 A | * | 11/1995 | Fan et al. | ...................... | 703/14 |
| 5,663,890 A | * | 9/1997 | Saleh et al. | ...................... | 703/4 |
| 5,684,723 A | * | 11/1997 | Nakadai | ...................... | 716/20 |
| 6,360,190 B1 | * | 3/2002 | Kumashiro | ...................... | 703/2 |
| 6,553,340 B1 | * | 4/2003 | Kumashiro | ...................... | 703/14 |
| 6,618,837 B1 | * | 9/2003 | Zhang et al. | ...................... | 716/4 |
| 6,851,097 B2 | * | 2/2005 | Zhang et al. | ...................... | 716/5 |
| 2003/0065498 A1 | * | 4/2003 | Bois et al. | ...................... | 703/19 |
| 2003/0158689 A1 | * | 8/2003 | Lai et al. | ...................... | 702/120 |

FOREIGN PATENT DOCUMENTS

JP  3-105268  5/1991  ........... G01R/31/26

* cited by examiner

Primary Examiner—Vuthe Siek
Assistant Examiner—Naum Levin
(74) Attorney, Agent, or Firm—Hayes Soloway P.C.

(57) ABSTRACT

In order to calculate, at high precision, capacitance parameters of an equivalent circuit model including tunnel conductances corresponding to a film thickness of a gate oxide film of an MOSFET to make reliability of device evaluation and circuit simulation improve, a computer preliminarily stores an equivalent circuit model, converts S parameter data into Y parameter data, determines whether it is possible or impossible to calculate the capacitance parameters on the basis of a real part secondary dependent area and an imaginary part primary dependent area of a frequency characteristic of the Y parameter data, generates relational expressions for Y parameters of a two-terminal pair circuit that correspond to the equivalent circuit model, measurement conditions, and a manufacturing condition of the MOFET when it is possible to calculate the capacitance parameters, producing approximated expressions by approximation conditions corresponding to the real part secondary dependent area and the imaginary part primary dependent area, and calculates the capacitance parameters on the basis of the approximated expressions on the basis of the approximated expressions and equations of the imaginary parts in the Y parameter data.

9 Claims, 6 Drawing Sheets

CAPACITANCE PARAMETERS CALCULATION METHOD FOR MOSFET AND PROGRAM THEREFOR

BACKGROUND OF THE INVENTION

This invention relates to a method of calculating capacitance parameters in an equivalent circuit model of a metal oxide semiconductor field effect transistor (MOSFET), and in particular, to a method of calculating the capacitance parameters in the equivalent circuit model of the MOSFET that fits for Y parameter data.

In the manner known in the art, the method of calculating the capacitance parameters in the equivalent circuit model of the type described is widely performed to evaluate a designed device or to carrying out a circuit simulation or a delay simulation on the designed device.

For instance, there is, as a most simplified method of calculating the capacitance parameters in the equivalent circuit model for the MOSFET, a method of measuring and calculating the capacitance parameters by using a C-V meter which is widely used in a high-frequency estimation of an electronic circuit. A first conventional method comprises the steps of connecting terminals of the MOSFET of a measured target to measurement terminals of the C-V meter, of measuring values of C and Q before and after a resonance state, respectively, and of calculating an impedance between the terminals of the MOSFET of the measured target from those measured values. In this event, the first conventional method comprises further the steps of measuring the values of C and Q by a combination of connections for a gate terminal, a drain terminal, a source terminal, and a substrate terminal of the MOSFET between the measurement terminals of the C-V meter, of solving a simultaneous equation including capacitance parameters in the equivalent circuit model of the MOSFET by corresponding the combination of terminal connections, and of calculating values of individual capacitance parameters.

In addition, there is, as another method, a second conventional method which comprises the steps of calculating S parameter data of a scattering matrix from transparence and reflection data at a high-frequency region measured with the MOSFET having a gate terminal input and a drain terminal output regarded as a two-terminal pair circuit, of converting the S parameter data into Y parameter data of an admittance matrix, and of calculating the capacitance parameters in the equivalent circuit model so as fit for the Y parameter data, in the manner which will later be described in conjunction with FIG. 1.

In the second conventional method, a relationship equation of the Y parameters in the two-terminal pair circuit and each equality of a real part and an imaginary part of the Y parameter data are simultaneous equations including parameters of the equivalent circuit model, respectively, and individual values of the parameters are calculated by solving the simultaneous equations. In this event, genuine capacitance parameters in an original equivalent circuit model of the MOSFET are calculated with high precision at a high operational frequency as well by manufacturing and measuring a dummy FET different from the MOSFET by a little to calculate S parameter date caused by parasitic capacitance parameters and by converting the S parameter data into Y parameter data with the parasitic capacitance parameters removed from the S parameter data calculated by measurement of the MOSFET, as described in, for example, Japanese Unexamined Patent Publication of Tokkai No. Hei 3-105,268 or JP-A 3-105268.

In addition, in the second conventional method, in a case of a measurement condition of measuring by applying a gate terminal of the MOSFET with a bias voltage which is not more than a threshold value, a voltage between a channel and a gate, a voltage between the channel and a substrate gate, and a current source corresponding to a mutual conductance can be zero to be remove from a two-terminal pair circuit, a relational expression of the Y parameter in the two-terminal pair circuit, and the capacitance parameters in the equivalent circuit model of the MOSFET are calculated.

In recent years, for purposes of high-speed of a large-scale integrated circuit or an LSI circuit, progression will directed to make a gate oxide film of the MOSFET a thin film. However, in the MOSFET having a gate length of 90 nanometers or less, a gate leakage component due to a tunnel current of the gate oxide film occurs and an affect of a gate electrode resistor corresponding to a film thickness of a gate electrode film connected to a gate terminal are not neglected on designing a device.

It is necessary for the gate electrode film and the gate oxide film of the MOSFET to set a CGR equivalent circuit model where the gate electrode resistor corresponding to the film thickness of the gate electrode film and a gate capacitor and a tunnel conductance which correspond to a film thickness of the gate oxide film are connected in series, in the manner which will later be described in conjunction with FIG. 2.

The method of calculating the capacitance parameters using the C-V meter is suitable to measurement of a relatively high impedance or a very low impedance because a principal using the resonance state of the circuit in the manner which is described above. However, the method of calculating the capacitance parameters using the C-V meter is disadvantageous in that it is difficult to carry out device evaluation having high reliability for measurement of impedance where the tunnel conductance corresponding to the gate leakage component is connected in parallel to the gate capacitor having a small value and is connected in series to the gate electrode resistor as the above-mentioned CGR equivalent circuit model. This is because measurement sensitivity is reduced and reliability of measured values is low in the measurement of such as impedance.

In addition, the method of calculating the capacitance parameters so as to fit for the Y parameter data is a method of solving the simultaneous equation corresponding to the real part and the imaginary part of the relational expression for the Y parameters of the two-terminal pair circuit and of calculating the respective values of the parameters in the manner which is described above. In general, the relational expression for the Y parameters of the two-terminal pair circuit becomes difficulty to solve the simultaneous equation when the number of parameters of series and parallel connections of the equivalent circuit model increases because reciprocal processings increase and the relational expression becomes a complex expression of a high order.

In the manner which is described above, in a case where it is impossible to ignore the tunnel conductance corresponding to the film thickness of the gate oxide film, it is therefore to ignore the gate electrode resistor corresponding to the film thickness of the gate electrode film also, and the gate capacitor and the tunnel conductance are connected in parallel between the gate electrode resistor and another electrode resistor, respectively, the second conventional method is generally disadvantageous in that it is difficult to solve the simultaneous equation and it is also difficult to calculate the capacitance parameters because an increase of the number of the parameters in the series-parallel connection.

SUMMARY OF THE INVENTION

It is an object of this invention to provide a capacitance parameter calculation method which is capable of calculating, in high precision, capacitance parameters of an equivalent circuit model including a gate electrode resistor and a tunnel conductance which correspond to a gate electrode film and a gate oxide film of a MOSFET, respectively.

It is another object of this invention to provide a capacitance parameter calculation method of the type described, which is capable of improving reliability of device evaluation.

It is still another object of this invention to provide a capacitance parameter calculation method of the type described, which is capable of improving reliability of circuit simulation.

Other objects of this invention will become clear as the description proceeds.

According to a first aspect of this invention, a method is for calculating, by using a computer, capacitance parameters in an equivalent circuit model of a metal oxide semiconductor field effect transistor (MOSFET). The method comprises the steps of calculating S parameter data of a scattering matrix from measured transparent and reflection data at a high frequency region with the MOSFET regarded as a two-terminal pair circuit, of converting the S parameter data of the scattering matrix into Y parameter data of an admittance matrix, and of calculating the capacitance parameters in the equivalent circuit model so as to fit for the Y parameter data. The method comprises the steps of preliminarily storing, as the equivalent circuit model, an equivalent circuit having a gate terminal, a drain terminal, a source terminal, and a substrate terminal, the equivalent circuit comprising a gate electrode resistor, a drain electrode resistor, a source electrode resistor, and a substrate electrode resistor which are connected to the gate terminal, the drain terminal, the source terminal, and the substrate terminal, respectively, the equivalent circuit comprising gate capacitors and tunnel conductances which correspond to a film thickness of a gate oxide film and an area between electrodes, respectively, the gate capacitors and the tunnel conductances being connected in parallel between the gate electrode resistor and one of the drain electrode resistor, the source electrode resistor, and the substrate electrode resistor, respectively, the equivalent circuit comprising junction capacitors of the electrodes and loss resistors which are connected in series between the substrate electrode resistor and one of the drain electrode resistor and the source electrode resistor, of determining whether it is possible or impossible to calculate the capacitance parameters on the basis of real part secondary dependent areas and imaginary part linear dependent areas in frequency characteristics of the Y parameter data, of outputting a message indicative of disapproval of calculation when it is impossible to calculate the capacitance parameters, of generating relational expressions of the Y parameters in the two-terminal pair circuit that correspond to the equivalent circuit model, measurement conditions, and a manufacturing condition of the MOSFET when it is possible to calculate the capacitance parameters, of approximating, by using approximation conditions corresponding to the real part secondary dependent areas and the imaginary part linear dependent areas, real parts and imaginary parts of the relational expressions for the Y parameters into secondary functions and linear functions to produce approximated expressions for the relational expressions of the Y parameters, and of calculating the capacitance parameters on the basis of the approximated expressions and equations for the imaginary parts of the Y parameter data.

According to a second aspect of this invention, a program product is for calculating capacitance parameters in an equivalent circuit model of a metal oxide semiconductor field effect transistor (MOSFET). The program product makes a computer execute processings of calculating S parameter data of a scattering matrix from measured transparent and reflection data at a high frequency region with the MOSFET regarded as a two-terminal pair circuit, of converting the S parameter data of the scattering matrix into Y parameter data of an admittance matrix, and of calculating the capacitance parameters in the equivalent circuit model so as to fit for the Y parameter data. The processings comprise preliminarily storing, as said equivalent circuit model, an equivalent circuit having a gate terminal, a drain terminal, a source terminal, and a substrate terminal, the equivalent circuit comprising a gate electrode resistor, a drain electrode resistor, a source electrode resistor, and a substrate electrode resistor which are connected to the gate terminal, the drain terminal, the source terminal, and the substrate terminal, respectively, the equivalent circuit comprising gate capacitors and tunnel conductances which correspond to a film thickness of a gate oxide film and an area between electrodes, respectively, the gate capacitors and the tunnel conductances being connected in parallel between the gate electrode resistor and one of the drain electrode resistor, the source electrode resistor, and the substrate electrode resistor, respectively, the equivalent circuit comprising junction capacitors of the electrodes and loss resistors which are connected in series between said substrate electrode resistor and one of the drain electrode resistor and the source electrode resistor; determining whether it is possible or impossible to calculate the capacitance parameters on the basis of real part secondary dependent areas and imaginary part linear dependent areas in frequency characteristics of said Y parameter data, outputting a message indicative of disapproval of calculation when it is impossible to calculate the capacitance parameters, generating relational expressions of the Y parameters in the two-terminal pair circuit that correspond to the equivalent circuit model, measurement conditions, and a manufacturing condition of the MOSFET when it is possible to calculate the capacitance parameters, approximating, by using approximation conditions corresponding to the real part secondary dependent areas and the imaginary part linear dependent areas, real parts and imaginary parts of the relational expressions for the Y parameters into secondary functions and linear functions to produce approximated expressions for the relational expressions of the Y parameters; and calculating the capacitance parameters on the basis of the approximated expressions and equations for the imaginary parts of the Y parameter data.

According to a third aspect of this invention, a capacitance parameters calculation system is for calculating capacitance parameters in an equivalent circuit model of a metal oxide semiconductor field effect transistor (MOSFET). The capacitance parameter calculation system comprises means for calculating S parameter data of a scattering matrix from measured transparent and reflection data at a high frequency region with the MOSFET regarded as a two-terminal pair circuit, means for converting the S parameter data of the scattering matrix into Y parameter data of an admittance matrix, and means for calculating the capacitance parameters in the equivalent circuit model so as to fit for the Y parameter data. The capacitance parameter calculation system comprises storing means for preliminarily storing, as the equivalent circuit model, an equivalent circuit having a gate terminal, a drain terminal, a source terminal, and a substrate terminal. The equivalent circuit comprises a gate electrode resistor, a drain electrode resistor, a source electrode resistor, and a substrate electrode resistor which are connected to the gate terminal, the drain terminal, the source terminal, and the substrate terminal, respectively. The equivalent circuit comprises gate capacitors and tunnel conductances which correspond to a film thickness of a gate oxide film and an area between electrodes, respectively. The gate capacitors and the tunnel conductances are connected in parallel between the gate electrode resistor and one of the drain electrode resistor, the source electrode resistor, and the substrate electrode resistor, respectively. The equivalent circuit comprises junction capacitors of the electrodes and loss resistors which are connected in series between the substrate electrode resistor and one of the drain electrode resistor and the source electrode resistor. Determining means determines whether it is possible or impossible to calculate the capacitance parameters on the basis of real part secondary dependent areas and imaginary part linear dependent areas in frequency characteristics of the Y parameter data. When it is impossible to calculate the capacitance parameters, outputting means outputs a message indicative of disapproval of calculation. When it is possible to calculate the capacitance parameters, generating means generates relational expressions of the Y parameters in the two-terminal pair circuit that correspond to the equivalent circuit model, measurement conditions, and a manufacturing condition of the MOSFET. Approximating means approximates, by using approximation conditions corresponding to the real part secondary dependent areas and the imaginary part linear dependent areas, real parts and imaginary parts of the relational expressions for the Y parameters into secondary functions and linear functions to produce approximated expressions for the relational expressions of the Y parameters. Calculating means calculates the capacitance parameters on the basis of the approximated expressions and equations for the imaginary parts of the Y parameter data.

The approximation conditions may comprise a first condition for comparing one with a first product of a total tunnel conductance of the gate oxide film and the gate electrode resistor to approximate the first product to zero, a second condition for comparing one with a first square of a second product of a total gate capacitor of the gate oxide film, the gate electrode resistor, and an angular frequency to approximate the first square to zero, and a third condition for comparing one with a second square of a third product of the junction capacitor, the loss resistor, and the angular frequency to approximate the second square to zero. In addition, determination of whether it is possible or impossible to calculate the capacitance parameters may be carried out by confirming the real part secondary dependent areas and the imaginary part linear dependent areas for each Y parameter and by corresponding the presence or absence of common areas in all of Y parameters.

Figure 1:
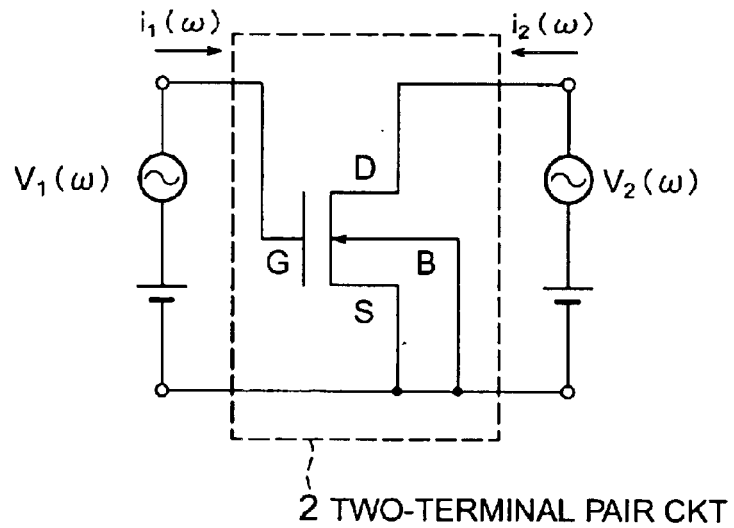
FIG. 1 shows a circuit diagram of a conventional measurement circuit where an MOSFET is regarded as a two-terminal pair circuit.

DESCRIPTION OF THE PREFERRED EMBODIMENTS:

Referring to FIG. 1, a conventional capacitance parameter calculation method will be described at first in order to facilitate an understanding of the present invention. The conventional capacitance parameter calculation method is the second conventional method, as mentioned in the preamble of the instant specification.

As shown in FIG. 1, a metal oxide semiconductor field effect transistor (MOSFET), which is a measured target, has a gate terminal G, a drain terminal D, a source terminal S, and a substrate terminal B. In the conventional capacitance parameter calculation method, the MOSFET is regarded as a two-terminal pair circuit which has, as an input terminal, the gate terminal G and, as an output terminal, the drain terminal D. The source terminal S and the substrate terminal B are connected to a ground terminal having a ground potential. An input current $i_1(\omega)$ flows to the gate terminal G and an input voltage $v_1(\omega)$ is applied between the gate terminal G and the ground terminal, where $\omega$ represents an angular frequency. An output current $i_2(\omega)$ flows to the drain terminal D and an output voltage $v_2(\omega)$ is generated between the drain terminal D and the ground terminal.

The conventional capacitance parameter calculation method comprises the steps of calculating S parameter data of a scattering matrix from measured transparent and reflection data at a high-frequency region, of converting the S parameter data into Y parameter data of an admittance matrix, and of calculating capacitance parameters of an equivalent circuit model so as to fit for the Y parameter data.

Figure 2:
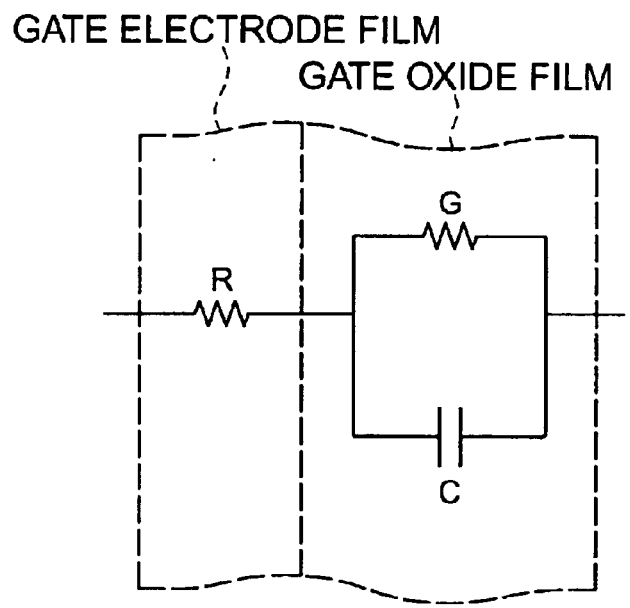
FIG. 2 is a circuit diagram showing a CGR equivalent circuit model for a gate electrode film and a gate oxide film of the MOSFET.

Referring to FIG. 2, the description will proceed to a CGR equivalent circuit model for the MOSFET having a gate length of 90 nanometers or less. The MOSFET has a gate electrode film and a gate oxide film. The CGR equivalent circuit model comprises a gate electrode resistor R, a gate capacitor C, and a tunnel conductance G. The gate electrode resistor R corresponds to the gate electrode film. The gate capacitor C and the tunnel conductance G correspond to the gate oxide film. The gate capacitor C and the tunnel conductance G are connected to each other in parallel to form a parallel circuit which is connected to the gate electrode resistor R in series.

The conventional capacitance parameter calculation method is disadvantageous in that it is difficult to solve a simultaneous equation, as mentioned in the preamble of the instant specification.

Figure 3:
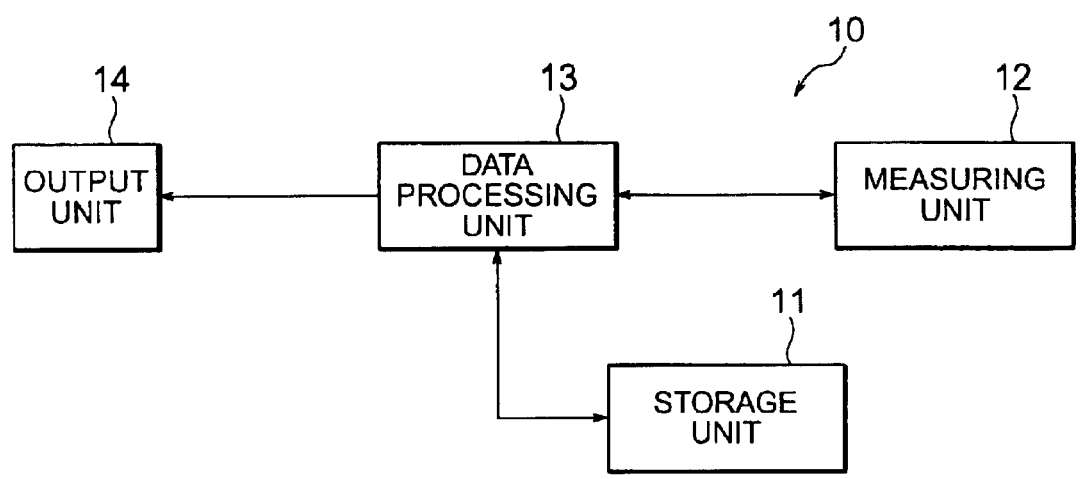
FIG. 3 is a block diagram of a computer for realizing a capacitance parameters calculation method in an equivalent circuit model of the MOSFET according to an embodiment of this invention.

Referring to FIG. 3, the description will proceed to a computer 10 for realizing a capacitance parameters calculation method in an equivalent circuit model of a MOSFET according to an embodiment of this invention. The capacitance parameters calculation method is executed, in response to each command, by the computer 10 which is installed with a capacitance parameters calculation program in the equivalent circuit model of the MOSFET.

The illustrated computer 10 comprises a storage unit 11, a measuring unit 12, a data processing unit 13, and an output unit 14.

Figure 4:
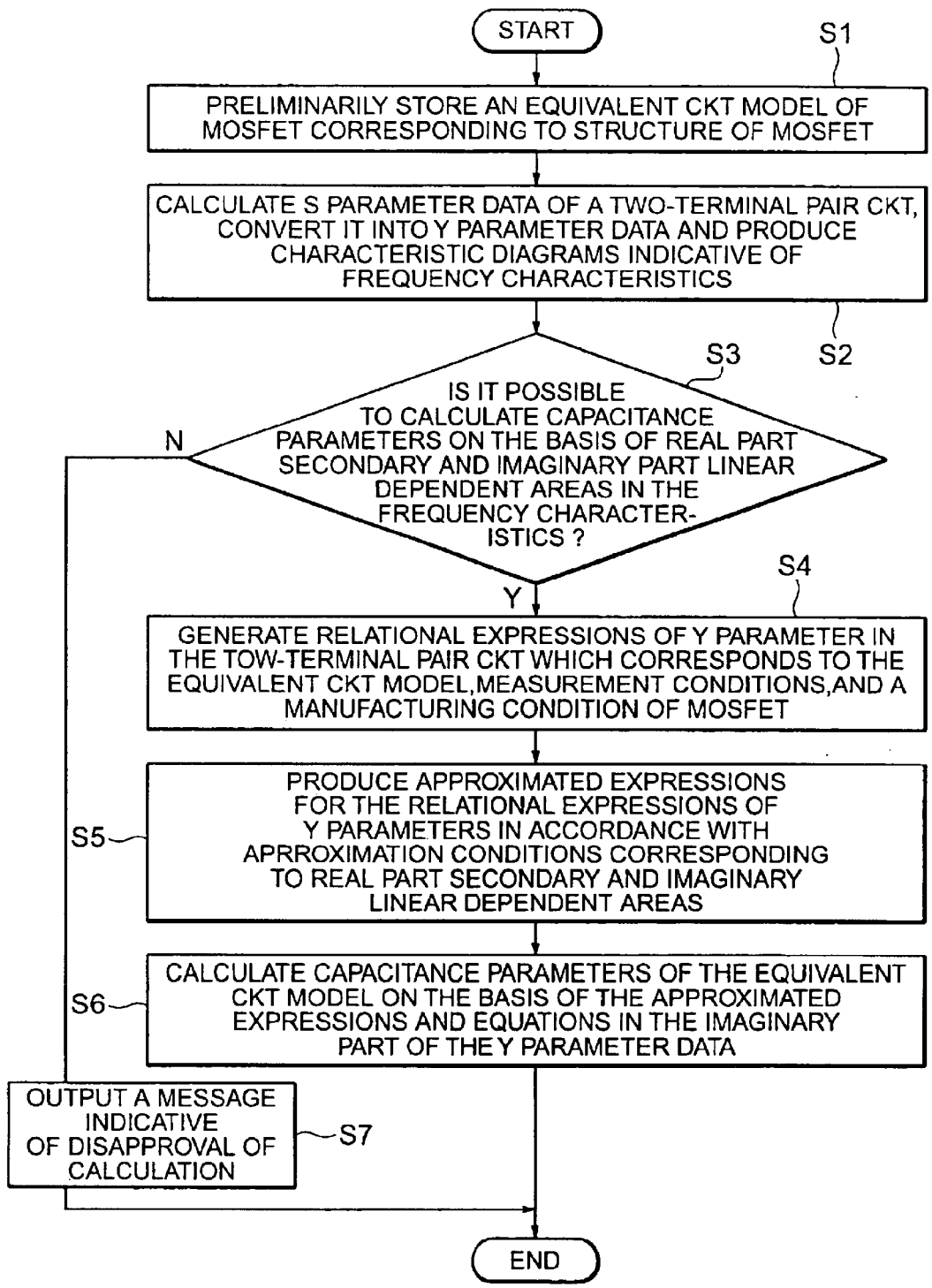
FIG. 4 is a flow chart for use in describing a capacitance parameters calculation program in the equivalent circuit model of the MOSFET.

FIG. 4 is a flow chart for use in describing the capacitance parameters calculation program in the equivalent circuit model of the MOSFET. The capacitance parameters calculation program comprises processings of first through seventh steps S1 to S7.

At the first step S1, the data processing unit 13 preliminarily stores, in the storage unit 11, an equivalent circuit model of the MOSFET corresponding to structure of the MOSFET. In the example being illustrated, the equivalent circuit model comprises a circuit model including a gate electrode resistor and a tunnel conductance which correspond to a film thickness of a gate electrode film and a film thickness of a gate oxide film, respectively.

Figure 5:
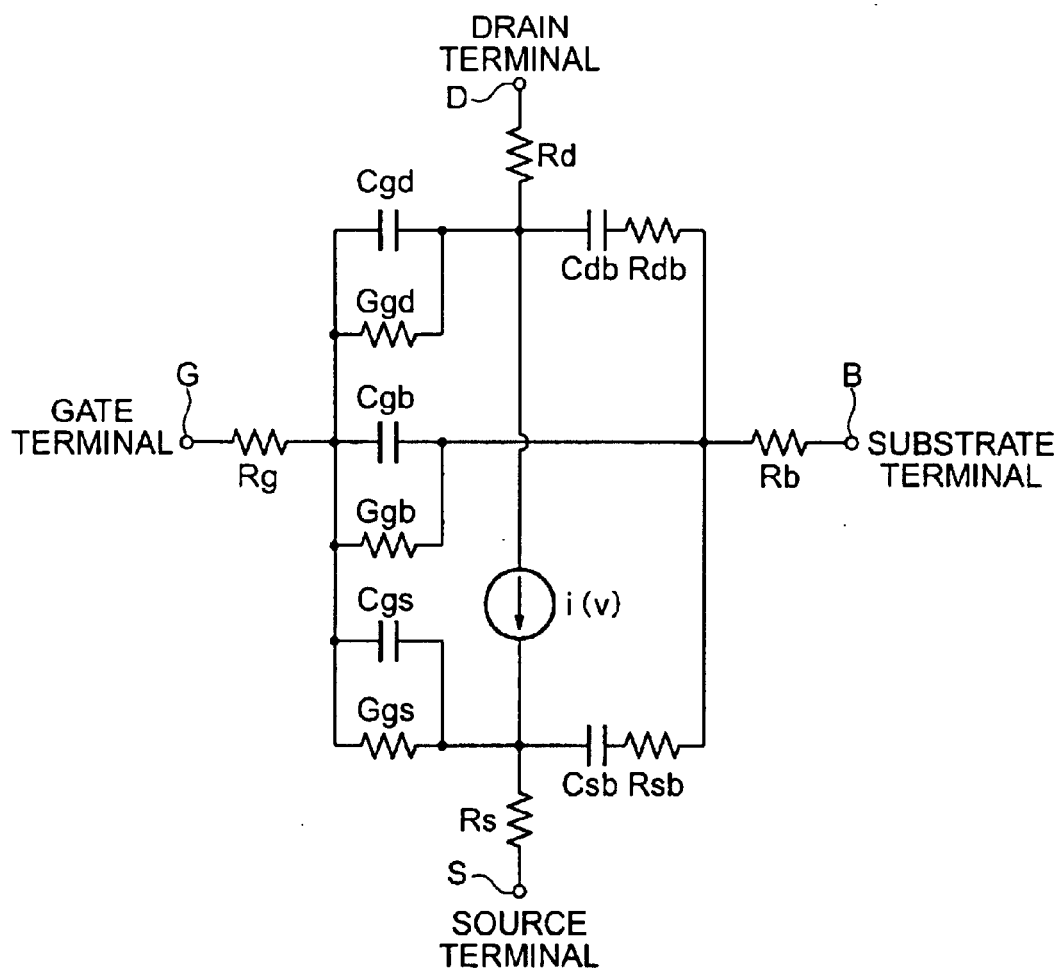
FIG. 5 is a circuit diagram showing the equivalent circuit model of the MOSFET.

FIG. 5 is a circuit diagram showing the equivalent circuit model of the MOSFET. The illustrated equivalent circuit model of the MOSFET has a gate terminal G, a drain terminal D, a source terminal S, and a substrate terminal B. The equivalent circuit model of the MOSFET comprises a gate electrode resistor Rg connected to the gate terminal G, a drain electrode resistor Rd connected to the drain terminal D, a source electrode resistor Rs connected to the source terminal S, and a substrate electrode resistor Rb connected to the substrate terminal B. The equivalent circuit model of the MOSFET further comprises first through third gate capacitors Cgd, Cgs, and Cgb which correspond to a film thickness of a gate oxide film and first through third tunnel conductances Ggd, Ggs, and Ggb which correspond to an area between the electrodes. The first gate capacitor Cgd and the first tunnel conductance Cgd are connected in parallel between the gate electrode resistor Rg and the drain electrode resistor Rd. The second gate capacitor Cgs and the second tunnel conductance Ggs are connected in parallel between the gate electrode resistor Rg and the source electrode resistor Rs. The third gate capacitor Cgd and the third tunnel conductance Ggb are connected in parallel between the gate electrode resistor Rg and the substrate electrode resistor Rb. The equivalent circuit model of the MOSFET comprises first and second junction capacitors Cdb and Csb of the electrodes and first and second loss resistors Rdb and Rsb of the electrodes. The first junction capacitor Cdb and the first loss resistor Rdb are connected in series between the substrate electrode resistor Rb and the drain electrode resistor Rd. The second junction capacitor Csb and the second loss resistor Rsb are connected in series between the substrate electrode resistor Rb and the source electrode resistor Rs. In addition, the equivalent circuit model of the MOFET comprises a current source i(v) connected between the drain electrode resistor Rd and the source electrode resistor Rs. The current source i(v) corresponds to a voltage between a channel and a gate, a voltage between the channel and a substrate gate, and a mutual conductance.

The first step S1 is followed by the second step S2 at which the measuring unit 12 measures transmission coefficient data and reflection coefficient data at a high-frequency region with the MOSFET having the gate terminal input and the drain terminal output serving as a measured target regarded as the two-terminal pair circuit to calculate S parameter data of a scattering matrix from the transmission coefficient data and the reflection coefficient data. Subsequently, the data processing unit 13 converts the S parameter data into Y parameter data of an admittance matrix to produce characteristic diagrams indicative of frequency characteristics of the Y parameter data.

The second step S2 proceeds to the third step S3 at which the data processing unit 13 determines whether it is possible or impossible to calculate capacitance parameters of the equivalent circuit model on the basis of real part secondary dependent areas and imaginary part linear dependent areas in the frequency characteristics of the Y parameter data. Determination of advisability of the calculation is carried out by confirming the real part secondary dependent areas and the imaginary part linear dependent areas every Y parameter and by corresponding to the presence or absence of common areas of all of the Y parameters.

Figure 6A:
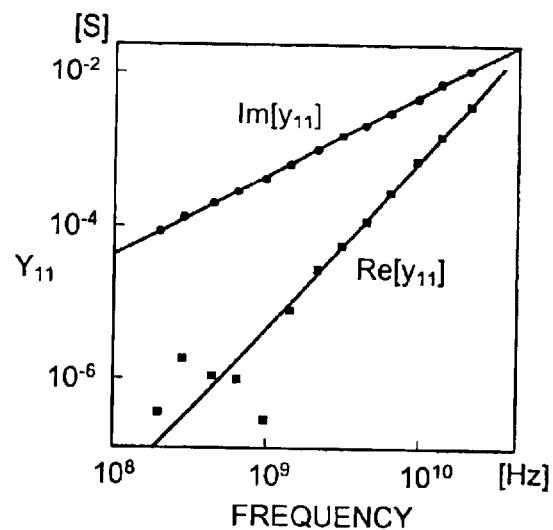
FIGS. 6A, 6B, and 6C collectively show characteristic diagrams of frequency characteristics of Y parameter data.
Figure 6B:
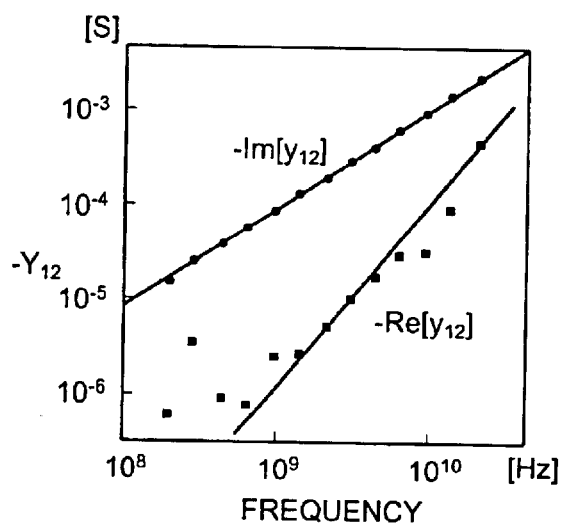
Figure 6C:
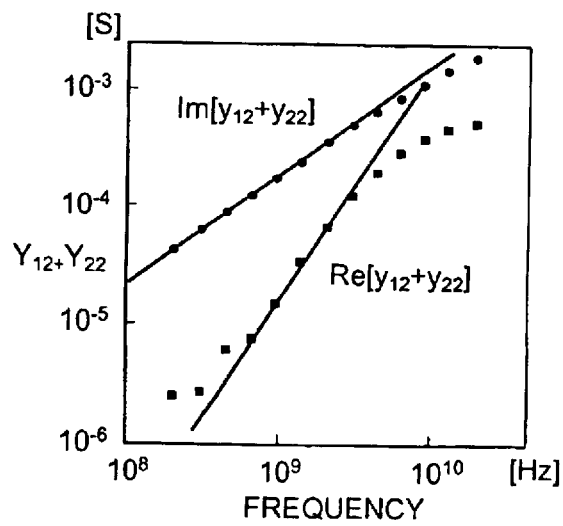

FIGS. 6A, 6B, and 6C collectively show the characteristic diagrams of the frequency characteristics of the Y parameter data. In FIGS. 6A to 6C, the ordinate represents an admittance [S] at a logarithmic scale and the abscissa represents a frequency [Hz] at a logarithmic scale. FIG. 6A shows a frequency characteristic of the Y parameter data Y11 of the two-terminal pair circuit. FIG. 6B shows a frequency characteristic of the Y parameter data Y12 of the two-terminal pair circuit. FIG. 6C shows a frequency characteristic of the Y parameter data Y12+Y22 of the two-terminal pair circuit.

Referring to FIG. 6A, the Y parameter data Y11 consists of a real part Re[Y11] and an imaginary part Im[Y11]. The real part Re[Y11] of the Y parameter data Y11 has a frequency characteristic having a real part secondary dependent area indicative of a secondary dependency at a frequency region between 1 GHz and 20 GHz. The imaginary part Im[Y11] of the Y parameter data Y11 has a frequency characteristic having an imaginary part linear dependent area indicative of a linear dependency at a frequency region between 200 MHz and 20 GHz. The parameter data Y11 has a frequency characteristic having a common area in the real part secondary dependent area and the imaginary part linear dependent area at a frequency region between 1 GHz and 20 GHz.

Referring to FIG. 6B, the Y parameter data Y12 consists of a real part −Re[Y12] and an imaginary part −Im[Y12]. The Y parameter data Y12 has a frequency characteristic having a common area in the real part secondary dependent area and the imaginary part linear dependent area at a frequency region between 1 GHz and 4 GHz.

Referring to FIG. 6C, the Y parameter data Y12+Y22 consists of a real part Re[Y12+Y22] and an imaginary part Im[Y12+Y22]. The Y parameter data Y12+Y22 has a frequency characteristic having a common area in the real part secondary dependent area and the imaginary part linear dependent area at a frequency region between 600 MHz and 2 GHz.

Accordingly, the frequency characteristics of the Y parameter data Y11, Y12, and Y12+Y22 have the common areas in the real part secondary dependent area and the imaginary part linear dependent area at a frequency region between 1 GHz and 2 GHz and the data processing unit 13 determines that it is possible to calculate the capacitance parameters.

It will be assumed that it is impossible to calculate the capacitance parameters. In this event, the third step S3 is succeeded by the seventh step S7 at which the data processing unit 13 outputs a message indicative of disapproval of the calculation on the output unit 14. It will be assumed that it is possible to calculate the capacitance parameters. In this event, the third step S3 is followed by the fourth step S4 at which the data processing unit 13 generates relational expressions of the Y parameter of the admittance matrix in the two-terminal pair circuit which corresponds to the equivalent circuit model of the MOSFET stored in the storage unit 11, measurement conditions and a manufacturing condition of the MOSFET.

It is assumed that a first one of the measurement conditions is a condition for carrying out measurement with the source terminal S and the substrate terminal B of the MOSFET connected to each other in common. In this event, the junction capacitor Csb of the source electrode and the loss resistor Rsb of the source electrode are removed from the two-terminal pair circuit. It will be assumed that a second one of the measurement conditions is a condition for carrying out measurement with the gate terminal applied with a bias voltage having a threshold value or less. In this event, the current source i(v) corresponding to the voltage between the channel and the gate, the voltage between the channel and the substrate gate, and the mutual conductance is removed from the two-terminal pair circuit. It will be assumed that the manufacturing condition of the MOSFET is a condition for manufacturing the MOSFET with the electrode resistors Rd, Rs, and Rb except for the gate electrode resistor Rg nearly equal to zero, namely, Rd|0, Rs|0, and Rb|0. In this event, the drain electrode resistor Rd, the source electrode resistor Rs, and the substrate electrode resistor Rb are removed from the two-terminal pair circuit.

Figure 7:
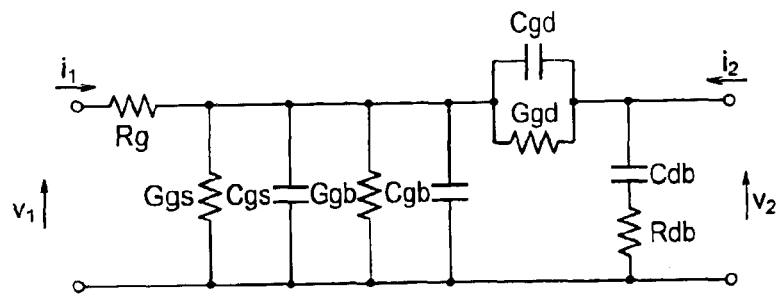
FIG. 7 is a circuit diagram showing a two-terminal pair circuit which corresponds to measurement conditions and a manufacturing condition of the MOSFET.
Figure 8A:
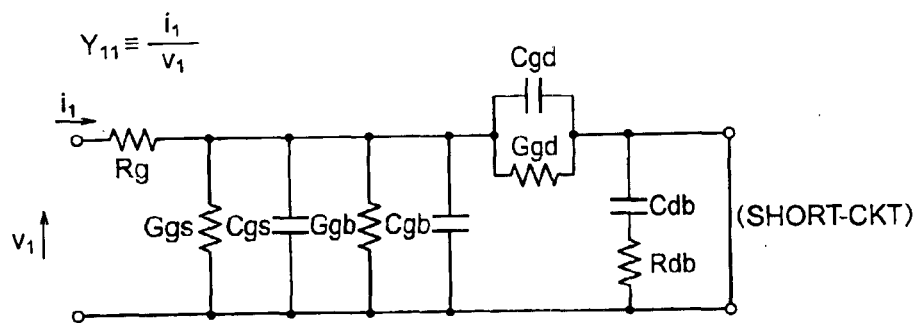
FIGS. 8A, 8B, and 8C are circuit diagrams showing equivalent circuits corresponding to definitions of the Y parameters.
Figure 8B:
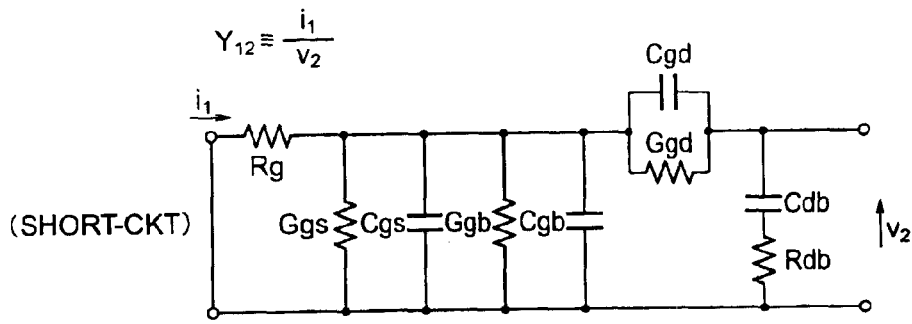
Figure 8C:
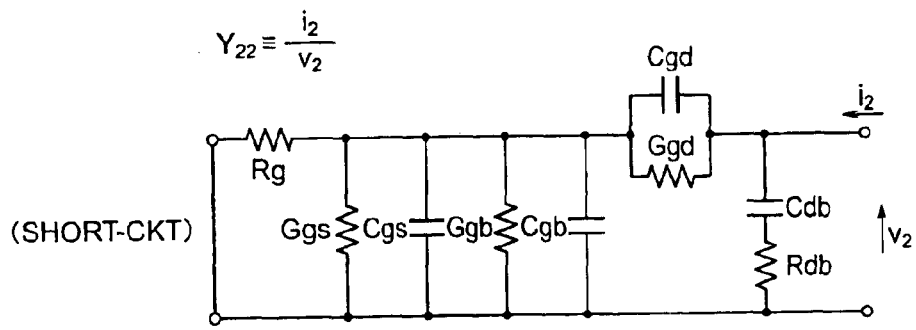

FIG. 7 is a circuit diagram showing the two-terminal pair circuit which corresponds to the above-mentioned measurement conditions and the above-mentioned manufacturing condition of the MOSFET. FIGS. 8A, 8B, and 8C are circuit diagrams showing equivalent circuits corresponding to definitions of the Y parameters. In the two-terminal pair circuit illustrated in FIG. 7, the Y parameters Y11, Y12, and Y22 represent an input admittance, a feedback admittance, and an output admittance. The relational expression of the Y parameter Y11 is calculated, on the basis of the two-terminal pair circuit having output terminals which are short-circuited as shown in FIG. 8A, by dividing an input current $i_1$ by an input voltage $v_1$, namely, $Y11 \equiv i_1/v_1$. The relational expression of the Y parameter Y12 is calculated, on the basis of the two-terminal pair circuit having input terminals which are short-circuited as shown in FIG. 8B, by dividing the input current $i_1$ by an output voltage $v_2$, namely, $Y12 \equiv i_1/v_2$. The relational expression of the Y parameter Y22 is calculated, on the basis of the two-terminal pair circuit having the input terminals which are short-circuited as shown in FIG. 8C, by dividing an output current $i_2$ by the output voltage $v_2$, namely, $Y22 \equiv i_2/v_2$.

It will be assumed that a total gate capacitor Cgg=Cgs+Cgb+Cgd and a total tunnel conductance Ggg=Ggs+Ggb+Ggd. Under the circumstances, a ratio Cgd/Cgg of the first gate capacitor Cgd to the total gate capacitor Cgg is nearly equal to a ratio Ggd/Ggg of the first tunnel conductance Ggd to the total tunnel conductance Ggg corresponding to an area between the electrodes, namely, Cdg/Cgg|Ggd/Ggg. The relational expressions of the Y parameters in the two-terminal pair circuit are represented by:

$$Y11 = \frac{(1 + Rg * Ggg) * Ggg + \omega^2 * Rg * Cgg^2 + j\omega * Cgg}{(1 + Rg * Ggg)^2 + (\omega * Rg * Cgg)^2},$$

$$Y12 = -\frac{(1 + Rg * Ggg) * Ggg + \omega^2 * Rg * Cgg * Cgd * j\omega * Cgd}{(1 + Rg * Ggg)^2 + (\omega * Rg * Cgg)^2},$$

and $$Y22 = -Y12 * \{1 + Rg * (Ggs + Ggb) + j\omega * Rg * (Cgs + Cgb)\} + \frac{\omega^2 * Rdb * Cdb^2 + j\omega * Rg * Cgb}{1 + (\omega * Rdb * Cdb)^2},$$

where j represents an imaginary unit of $\sqrt{-1}$ and $\omega$ represents an angular frequency.

The fourth step S4 proceeds to the fifth step S5 at which the data processing unit 13 approximates, in accordance with approximation conditions corresponding to the real part secondary dependent areas and the imaginary part linear dependent areas in the total of the Y parameter data, the real parts and the imaginary parts in the relation expressions of the Y parameters in the two-terminal pair circuit into secondary functions and linear functions, respectively, to produce approximated expressions for the relational expressions of the Y parameters.

In the example being illustrated, the approximation conditions comprises first through third approximation conditions. More specifically, the first approximation condition is a condition for comparing one with a first product Rg·Ggg of the total tunnel conductance Ggg of the gate oxide film and the gate electrode resistor Rg to approximate the first product to zero, namely, Rg·Ggg|1. The second approximation condition is a condition for comparing one with a first square $(\omega \cdot Rg \cdot Cgg)^2$ of a second produt of the total gate capacitor Cgg of the gate oxide film, the gate electrode resistor Rg, and the angular frequency $\omega$ to approximate the first square to zero, namely, $(\omega \cdot Rg \cdot Cgg)^2|1$. The third approximation condition is a condition for comparing one with a second square $(\omega \cdot Rdb \cdot Cdb)^2$ of a third product of the first junction capacitor Cdb, the first loss resistor Rdb, and the angular frequency $\omega$ to approximate the second square to zero, namely, $(\omega \cdot Rdb \cdot Cdb)^2|1$. By the first through the third approximation conditions, the following three conditions are satisfied:

Rg·(Ggs+Ggd)|1,

Rg·Ggd|1, and $\omega^2$·Rg$^2$·Cgg·Cgd|1.

Accordingly, the real parts and the imaginary parts in the relational expressions of the Y parameters are approximated to the secondary functions and the linear functions to produce the approximated expressions of the Y parameters as follows:

$Y11 = Ggg + \omega^2 * Rg * Cgg^2 + j\omega * Cgg$, $Y12 = -Ggd - \omega^2 * Rg * Cgg * Cgd - j\omega * Cgd$, and $Y12 + Y22 = -\omega^2 * Rg * Cgd * (Cgs + Cgb) + \omega^2 * Rdb * Cdb^2 + j\omega * Cdb$.

The fifth step S5 is succeeded by the sixth step S6 at which the data processing unit 13 calculates, on the basis of the above-mentioned approximated expressions of the Y parameters and equations in the imaginary parts of the Y parameter data, capacitance parameters Cgg, Cgd, and Cdb as follows:

$$Cgg = \frac{\text{Im}[Y11]}{\omega},$$

$$Cgd = -\frac{\text{Im}[Y12]}{\omega}, \text{ and}$$

$$Cdb = \frac{\text{Im}[Y12 + Y22]}{\omega}.$$

In the manner which is described above, the capacitance parameters calculation method of the equivalent circuit model in the MOSFET according to the embodiment of this invention can calculate the capacitance parameters Cgg, Cgd, and Cdb of the equivalent circuit model in the MOSFET at a high operating frequency at a high precision in a case where it is impossible to neglect the tunnel conductances corresponding to the film thickness of the gate oxide film, it is therefore also impossible to neglect the gate electrode resistor corresponding to the film thickness of the gate electrode film, and the gate capacitors and the tunnel conductances are connected in parallel between the gate electrode resistor and the other electrode resistors, respectively.

It will be assumed that the MOSFET has the drain electrode and the source electrode which have asymmetric structure in the capacitance parameters calculation method of the equivalent circuit model in the MOSFET. Under the circumstances, capacitance parameters Cgs and Csd may be calculated as capacitance parameters Cgd and Cdb by regarding the MOSFET as a two-terminal pair circuit with the drain terminal and the source terminal exchanged to each other. It will be assumed that the MOSFET has the drain electrode and the source electrode which have symmetric structure in the capacitance parameter calculation method of the equivalent circuit model in the MOSFET. In this event, capacitance parameters Cgs and Csd may be calculated so as to equivalent to capacitance parameters Cgd and Cdb. In addition, a capacitance parameter Cgb may be calculated from capacitance parameters Cgg, Cgd, and Cgs.

It will be assumed that it is impossible to calculate the capacitance parameters in the capacitance parameter calculation method of the equivalent circuit model in the MOSFET. In this event, by an engineer, validity/invalidity in the first Y parameter approximation condition of Rg·Ggg|1 is separately confirmed by a DC measurement. Validity/invalidity in the first and the second Y parameter approximation conditions of Rg·Ggg|1 and (ω·Rg·Cgg)2|1 is individually confirmed on the basis of the real part secondary dependent area and the imaginary part primary dependent area in the Y parameter data Y11 and Y12. It will be assumed that those Y parameter approximation conditions are invalid. In this event, the measurement conditions and the manufacturing conditions of the MOSFET or the equivalent circuit model are reconfirmed.

While this invention has thus far been described in conjunction with a preferred embodiment thereof, it will readily be possible for those skilled in the art to put this invention into practice in various other manners.

What is claimed is:

1. A method of calculating, by using a computer, capacitance parameters in an equivalent circuit model of a metal oxide semiconductor field effect transistor (MOSFET), said method comprising the steps of calculating S parameter data of a scattering matrix from measured transparent and reflection data at a high frequency region with the MOSFET regarded as a two-terminal pair circuit, of converting the S parameter data of the scattering matrix into Y parameter data of an admittance matrix, and of calculating the capacitance parameters in the equivalent circuit model so as to fit for the Y parameter data, said method comprising the steps of:

preliminarily storing, as said equivalent circuit model, an equivalent circuit having a gate terminal, a drain terminal, a source terminal, and a substrate terminal, said equivalent circuit comprising a gate electrode resistor, a drain electrode resistor, a source electrode resistor, and a substrate electrode resistor which are connected to the gate terminal, the drain terminal, the source terminal, and the substrate terminal, respectively, said equivalent circuit comprising gate capacitors and tunnel conductances which correspond to a film thickness of a gate oxide film and an area between electrodes, respectively, the gate capacitors and the tunnel conductances being connected in parallel between said gate electrode resistor and one of said drain electrode resistor, said source electrode resistor, and said substrate electrode resistor, respectively, said equivalent circuit comprising junction capacitors of the electrodes and loss resistors which are connected in series between said substrate electrode resistor and one of said drain electrode resistor and said source electrode resistor;

determining whether it is possible or impossible to calculate the capacitance parameters on the basis of real part secondary dependent areas and imaginary part linear dependent areas in frequency characteristics of said Y parameter data;

outputting a message indicative of disapproval of calculation when it is impossible to calculate the capacitance parameters;

generating relational expressions of the Y parameters in said two-terminal pair circuit that correspond to the equivalent circuit model, measurement conditions, and a manufacturing condition of said MOSFET when it is possible to calculate the capacitance parameters;

approximating, by using approximation conditions corresponding to said real part secondary dependent areas and said imaginary part linear dependent areas, real parts and imaginary parts of the relational expressions for said Y parameters into secondary functions and linear functions to produce approximated expressions for the relational expressions of said Y parameters; and calculating said capacitance parameters on the basis of said approximated expressions and equations for the imaginary parts of said Y parameter data.

2. A method as claimed in claim 1, wherein said approximation conditions comprise:

a first condition for comparing one with a first product of a total tunnel conductance of said gate oxide film and said gate electrode resistor to approximate the first product to zero;

a second condition for comparing one with a first square of a second product of a total gate capacitor of said gate oxide film, said gate electrode resistor, and an angular frequency to approximate the first square to zero; and a third condition for comparing one with a second square of a third product of said junction capacitor, said loss resistor, and the angular frequency to approximate the second square to zero.

3. A method as claimed in claim 1, wherein determination of whether it is possible or impossible to calculate the capacitance parameters is carried out by confirming said real part secondary dependent areas and said imaginary part linear dependent areas for each Y parameter and by corresponding the presence or absence of common areas in all of Y parameters.

4. A program product for calculating capacitance parameters in an equivalent circuit model of a metal oxide semiconductor field effect transistor (MOSFET), said program product making a computer execute processings of calculating S parameter data of a scattering matrix from measured transparent and reflection data at a high frequency region with the MOSFET regarded as a two-terminal pair circuit, of converting the S parameter data of the scattering matrix into Y parameter data of an admittance matrix, and of calculating the capacitance parameters in the equivalent circuit model so as to fit for the Y parameter data, said processings comprising:

preliminarily storing, as said equivalent circuit model, an equivalent circuit having a gate terminal, a drain terminal, a source terminal, and a substrate terminal, said equivalent circuit comprising a gate electrode resistor, a drain electrode resistor, a source electrode resistor, and a substrate electrode resistor which are connected to the gate terminal, the drain terminal, the source terminal, and the substrate terminal, respectively, said equivalent circuit comprising gate capacitors and tunnel conductances which correspond to a film thickness of a gate oxide film and an area between electrodes, respectively, the gate capacitors and the tunnel conductances being connected in parallel between said gate electrode resistor and one of said drain electrode resistor, said source electrode resistor, and said substrate electrode resistor, respectively, said equivalent circuit comprising junction capacitors of the electrodes and loss resistors which are connected in series between said substrate electrode resistor and one of said drain electrode resistor and said source electrode resistor;

determining whether it is possible or impossible to calculate the capacitance parameters on the basis of real part secondary dependent areas and imaginary part linear dependent areas in frequency characteristics of said Y parameter data;

outputting a message indicative of disapproval of calculation when it is impossible to calculate the capacitance parameters;

generating relational expressions of the Y parameters in said two-terminal pair circuit that correspond to the equivalent circuit model, measurement conditions, and a manufacturing condition of said MOSFET when it is possible to calculate the capacitance parameters;

approximating, by using approximation conditions corresponding to said real part secondary dependent areas and said imaginary part linear dependent areas, real parts and imaginary parts of the relational expressions for said Y parameters into secondary functions and linear functions to produce approximated expressions for the relational expressions of said Y parameters; and calculating said capacitance parameters on the basis of said approximated expressions and equations for the imaginary parts of said Y parameter data.

5. A program product as claimed in claim 4, wherein said approximation conditions comprise:

a first condition for comparing one with a first product of a total tunnel conductance of said gate oxide film and said gate electrode resistor to approximate the first product to zero;

a second condition for comparing one with a first square of a second product of a total gate capacitor of said gate oxide film, said gate electrode resistor, and an angular frequency to approximate the first square to zero; and a third condition for comparing one with a second square of a third product of said junction capacitor, said loss resistor, and the angular frequency to approximate the second square to zero.

6. A program product as claimed in claim 4, wherein determination of whether it is possible or impossible to calculate the capacitance parameters is carried out by confirming said real part secondary dependent areas and said imaginary part linear dependent areas for each Y parameter and by corresponding the presence or absence of common areas in all of Y parameters.

7. A capacitance parameters calculation system for calculating capacitance parameters in an equivalent circuit model of a metal oxide semiconductor field effect transistor (MOSFET), said capacitance parameter calculation system comprising means for calculating S parameter data of a scattering matrix from measured transparent and reflection data at a high frequency region with the MOSFET regarded as a two-terminal pair circuit, means for converting the S parameter data of the scattering matrix into Y parameter data of an admittance matrix, and means for calculating the capacitance parameters in the equivalent circuit model so as to fit for the Y parameter data, said capacitance parameter calculation system comprising:

storing means for preliminarily storing, as said equivalent circuit model, an equivalent circuit having a gate terminal, a drain terminal, a source terminal, and a substrate terminal, said equivalent circuit comprising a gate electrode resistor, a drain electrode resistor, a source electrode resistor, and a substrate electrode resistor which are connected to the gate terminal, the drain terminal, the source terminal, and the substrate terminal, respectively, said equivalent circuit comprising gate capacitors and tunnel conductances which correspond to a film thickness of a gate oxide film and an area between electrodes, respectively, the gate capacitors and the tunnel conductances being connected in parallel between said gate electrode resistor and one of said drain electrode resistor, said source electrode resistor, and said substrate electrode resistor, respectively, said equivalent circuit comprising junction capacitors of the electrodes and loss resistors which are connected in series between said substrate electrode resistor and one of said drain electrode resistor and said source electrode resistor;

determining means for determining whether it is possible or impossible to calculate the capacitance parameters on the basis of real part secondary dependent areas and imaginary part linear dependent areas in frequency characteristics of said Y parameter data;

outputting means for outputting a message indicative of disapproval of calculation when it is impossible to calculate the capacitance parameters;

generating means for generating relational expressions of the Y parameters in said two-terminal pair circuit that correspond to the equivalent circuit model, measurement conditions, and a manufacturing condition of said MOSFET when it is possible to calculate the capacitance parameters;

approximating means for approximating, by using approximation conditions corresponding to said real part secondary dependent areas and said imaginary part linear dependent areas, real parts and imaginary parts of the relational expressions for said Y parameters into secondary functions and linear functions to produce approximated expressions for the relational expressions of said Y parameters; and calculating means for calculating said capacitance parameters on the basis of said approximated expressions and equations for the imaginary parts of said Y parameter data.

8. A capacitance parameters calculation system as claimed in claim 7, wherein said approximation conditions comprise:
- a first condition for comparing one with a first product of a total tunnel conductance of said gate oxide film and said gate electrode resistor to approximate the first product to zero;
- a second condition for comparing one with a first square of a second product of a total gate capacitor of said gate oxide film, said gate electrode resistor, and an angular frequency to approximate the first square to zero; and
- a third condition for comparing one with a second square of a third product of said junction capacitor, said loss resistor, and the angular frequency to approximate the second square to zero.

9. A capacitance parameters calculation system as claimed in claim 7, wherein determination of whether it is possible or impossible to calculate the capacitance parameters by said determining means is carried out by confirming said real part secondary dependent areas and said imaginary part linear dependent areas for each Y parameter and by corresponding the presence or absence of common areas in all of Y parameters.

* * * * *